United States Patent
Lee et al.

(10) Patent No.: US 11,086,427 B2
(45) Date of Patent: Aug. 10, 2021

(54) PRESSURE SENSOR AND DISPLAY DEVICE HAVING THE SAME

(71) Applicant: Samsung Display Co., Ltd., Yongin-si (KR)

(72) Inventors: Choon Hyop Lee, Yongin-si (KR); Kang Won Lee, Yongin-si (KR); Sang Chul Lee, Yongin-si (KR); Seung Hwan Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/414,741

(22) Filed: May 16, 2019

(65) Prior Publication Data
US 2020/0133421 A1 Apr. 30, 2020

(30) Foreign Application Priority Data
Oct. 30, 2018 (KR) .......................... 10-2018-0131250

(51) Int. Cl.
*G06F 3/041* (2006.01)
(52) U.S. Cl.
CPC .................................. *G06F 3/0412* (2013.01)
(58) Field of Classification Search
CPC ...................................................... G06F 3/0412
See application file for complete search history.

(56) References Cited

U.S. PATENT DOCUMENTS

| | | | | |
|---|---|---|---|---|
| 2005/0007721 A1* | 1/2005 | Akkipeddi | ............ | G01L 1/2293 361/179 |
| 2011/0084346 A1* | 4/2011 | Mori | ......................... | G01L 1/20 257/415 |
| 2013/0271161 A1* | 10/2013 | Sol ven | .................. | G06F 3/041 324/661 |
| 2015/0109237 A1* | 4/2015 | Liang | .................. | G06F 3/04886 345/174 |

(Continued)

FOREIGN PATENT DOCUMENTS

| KR | 10-2016-0150070 | 12/2016 |
|---|---|---|
| KR | 10-2018-0010952 | 1/2018 |
| KR | 10-2018-0036469 | 4/2018 |

*Primary Examiner* — Kent W Chang
*Assistant Examiner* — Scott D Au
(74) *Attorney, Agent, or Firm* — H.C. Park & Associates, PLC

(57) ABSTRACT

A pressure sensor includes a first substrate and a second substrate; a first driving electrode and a second driving electrode disposed on a first surface of the first substrate facing the second substrate and coupled to a first coupling electrode, the second driving electrode being shorter than the first driving electrode; a first sensing electrode and a second sensing electrode disposed on the first surface of the first substrate and coupled to a second coupling electrode, the second sensing electrode being shorter than the first sensing electrode; a first pressure sensing layer disposed on a first surface of the second substrate in a position facing the first substrate and overlapping and spaced from the first driving electrode and the first sensing electrode by a gap; and a second pressure sensing layer contacting with the second (Continued)

driving electrode and the second sensing electrode and electrically coupling the second driving electrode and the second sensing electrode to each other.

20 Claims, 12 Drawing Sheets

(56) References Cited

U.S. PATENT DOCUMENTS

| | | |
|---|---|---|
| 2017/0068368 A1* | 3/2017 | Hsiao ...................... G06F 3/044 |
| 2017/0357344 A1* | 12/2017 | Hong .................... G06F 3/0416 |
| 2018/0095582 A1 | 4/2018 | Hwang et al. |
| 2018/0188874 A1 | 7/2018 | Cho et al. |
| 2018/0292279 A1* | 10/2018 | Chen ....................... G06F 3/016 |

* cited by examiner

PRESSURE SENSOR AND DISPLAY DEVICE HAVING THE SAME

CROSS-REFERENCE TO RELATED APPLICATION

This application claims priority from and the benefit of Korean Patent Application number 10-2018-0131250, filed on Oct. 30, 2018, which is hereby incorporated by reference for all purposes as if fully set forth herein.

BACKGROUND

Field

Exemplary implementations of the invention relate generally to a pressure sensor and a display device having the same and, more specifically, to a pressure sensor and a display device having the same including multiple pressure sensing cells.

Discussion of the Background

As interest in displays has heightened, research into display devices and the commercialization of display devices have been conducted with priority. In particular, a recent display device includes a touch panel, so that, when a user's hand or an object touches a display panel without using a mouse or an additional input device, the indication selected at the location of a touch may be an input signal for the display device.

Recently, research into technology has been conducted to implement various inputs by further developing the touch panel and mounting a pressure (force) sensor on a display device. A resistance value sensed by the pressure sensor differs depending on a force with which a user presses the pressure sensor. For example, when the force with which the user presses the pressure sensor is low, the resistance value sensed by the pressure sensor is relatively high, whereas when the force with which the user presses the pressure sensor is high, the resistance value sensed by the pressure sensor is relatively low. Depending on the above-described resistance value, various functions may be provided to the user.

The above information disclosed in this Background section is only for understanding of the background of the inventive concepts, and, therefore, it may contain information that does not constitute prior art.

SUMMARY

Pressure sensors and display devices having the same constructed according to exemplary implementations of the invention are capable of improving sensitivity to pressure and/or being manufactured with relatively low cost. The sensitivity to pressure may be improved and/or the manufacturing cost may be decreased by setting the variations between resistance values of pressure sensing cells adjusted according to the principles of the invention.

More specifically, according to the principles and some exemplary implementations of the invention, the initial resistance values of respective pressure sensing cells of the pressure sensor may be set, and the range of resistance values that can be sensed by the pressure sensing cells may be greatly decreased, and thus manufacturing costs of the pressure sensing cells may be decreased. In addition, variations between the resistances of respective pressure sensing cells in some exemplary pressure sensors of the invention may be decreased.

Additional features of the invention will be set forth in the description which follows, and in part will be apparent from the description, or may be learned by practice of the invention.

A pressure sensor constructed according to one or more embodiments includes a first substrate and a second substrate; a first driving electrode and a second driving electrode disposed on a first surface of the first substrate facing the second substrate and coupled to a first coupling electrode, the second driving electrode being shorter than the first driving electrode; a first sensing electrode and a second sensing electrode disposed on the first surface of the first substrate and coupled to a second coupling electrode, the second sensing electrode being shorter than the first sensing electrode; a first pressure sensing layer disposed on a first surface of the second substrate in a position facing the first substrate and overlapping and spaced from the first driving electrode and the first sensing electrode by a gap; and a second pressure sensing layer contacting with the second driving electrode and the second sensing electrode and electrically coupling the second driving electrode and the second sensing electrode to each other.

The second pressure sensing layer may include at least two second pressure sensing layers electrically coupled to each other.

The pressure sensor may further include a sub-electrode coupling the at least two second pressure sensing layers to each other.

The sub-electrode may include substantially the same material disposed in substantially the same plane as that of the first driving electrode, the first sensing electrode, the second driving electrode, and the second sensing electrode.

The pressure sensor may further include a third pressure sensing layer coupling the at least two second pressure sensing layers to each other, the third pressure sensing layer at least partially contacting top surfaces of the second pressure sensing layers.

The pressure sensor may further include a conductive layer, at least part of which is in contact with the second pressure sensing layer.

The conductive layer may have a resistance lower than a resistance of the second pressure sensing layer.

Each of the first pressure sensing layer and the second pressure sensing layer may include a polymer and conductive particles dispersed in the polymer.

A pressure sensor constructed according to another embodiment includes a first substrate and a second substrate; a first driving electrode, a second driving electrode, a first sensing electrode, and a second sensing electrode which are disposed on a first surface of the first substrate facing the second substrate, wherein the second driving electrode is electrically coupled to the first driving electrode and the second sensing electrode is electrically coupled to the first sensing electrode; a first pressure sensing layer disposed on a first surface of the second substrate in a position facing the first substrate and overlapping and spaced from the first driving electrode and the first sensing electrode by a gap; a conductive layer disposed on the first surface of the second substrate, and at least partially contacting the first pressure sensing layer; and a second pressure sensing layer contacting the second driving electrode and the second sensing electrode and electrically coupling the second driving electrode and the second sensing electrode to each other.

The conductive layer may be disposed closer to the second substrate than the first pressure sensing layer.

The conductive layer may have a resistance lower than a resistance of the first pressure sensing layer.

The pressure sensor may further include a fourth pressure sensing layer disposed on a first surface of the first pressure sensing layer so that the fourth pressure sensing layer is closer to the first driving electrode and the first sensing electrode than the first pressure sensing layer.

The fourth pressure sensing layer may have a resistance higher than a resistance of the conductive layer.

The first pressure sensing layer may have a first surface facing the first driving electrode and the first sensing electrode, and the first surface of the first pressure sensing layer may include an uneven part.

The first pressure sensing layer may include a polymer and conductive particles dispersed in the polymer, and the uneven part may include the conductive particles exposed from a surface of the polymer or by a surface of the polymer having a shape of the uneven part.

A display device constructed according to one or more embodiments includes a display panel; and a pressure sensor disposed on a first surface of the display panel, wherein the pressure sensor includes: a first substrate and a second substrate; a first driving electrode and a second driving electrode disposed on a first surface of the first substrate facing the second substrate and coupled to a first coupling electrode, the second driving electrode being shorter than the first driving electrode; a first sensing electrode and a second sensing electrode disposed on the first surface of the first substrate and coupled to a second coupling electrode, the second sensing electrode being shorter than the first sensing electrode; a first pressure sensing layer disposed on a first surface of the second substrate in a position facing the first substrate and overlapping and spaced from the first driving electrode and the first sensing electrode by a gap; and a second pressure sensing layer in contact with the second driving electrode and the second sensing electrode to electrically couple the second driving electrode and the second sensing electrode to each other.

The display panel may include a base substrate and pixels arranged on the base substrate, and one of the first substrate and the second substrate of the pressure sensor may include the base substrate of the display panel.

A display device constructed according to another embodiment includes a display panel; and a pressure sensor disposed on a first surface of the display panel, wherein the pressure sensor includes: a first substrate and a second substrate; a first driving electrode, a second driving electrode, a first sensing electrode, and a second sensing electrode all of which are disposed on a first surface of the first substrate facing the second substrate, wherein the second driving electrode is electrically coupled to the first driving electrode and the second sensing electrode is electrically coupled to the first sensing electrode; a first pressure sensing layer disposed on a first surface of the second substrate facing the first substrate in a position overlapping and spaced from the first driving electrode and the first sensing electrode by a gap; a conductive layer disposed on the first surface of the second substrate, and at least partially contacting the first pressure sensing layer; and a second pressure sensing layer in contact with the second driving electrode and the second sensing electrode to electrically couple the second driving electrode and the second sensing electrode to each other.

The display panel may include a base substrate and pixels arranged on the base substrate, and one of the first substrate and the second substrate of the pressure sensor may include the base substrate of the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
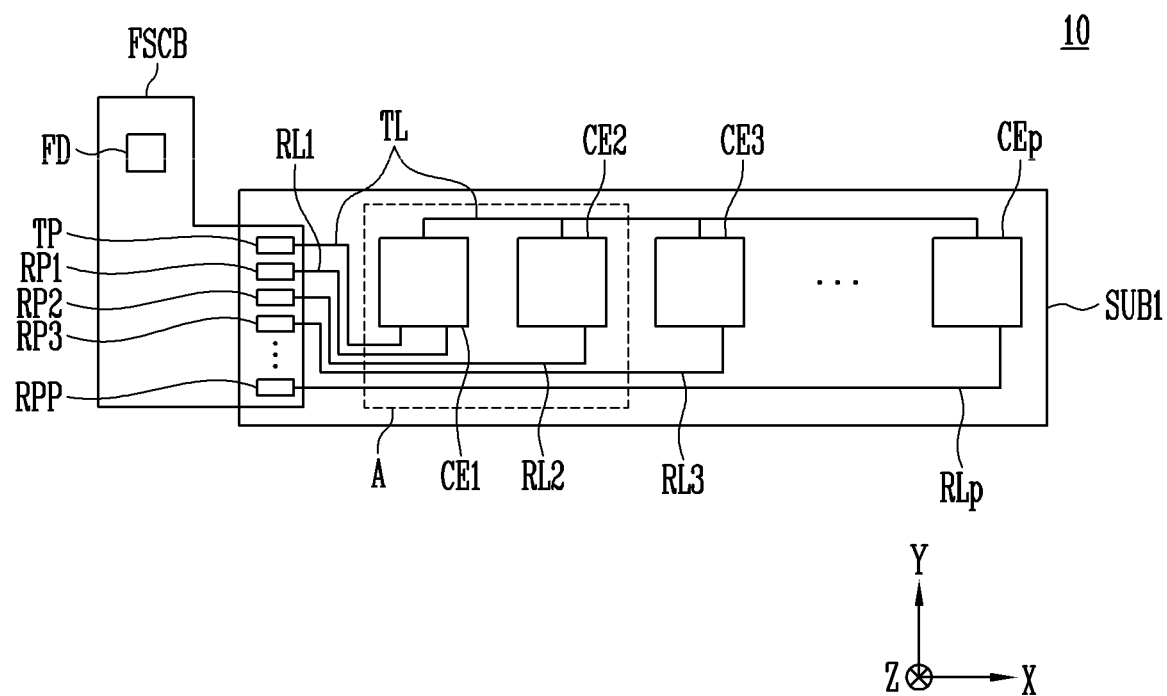
FIG. 1 is a plan view of an exemplary embodiment of a pressure sensor constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
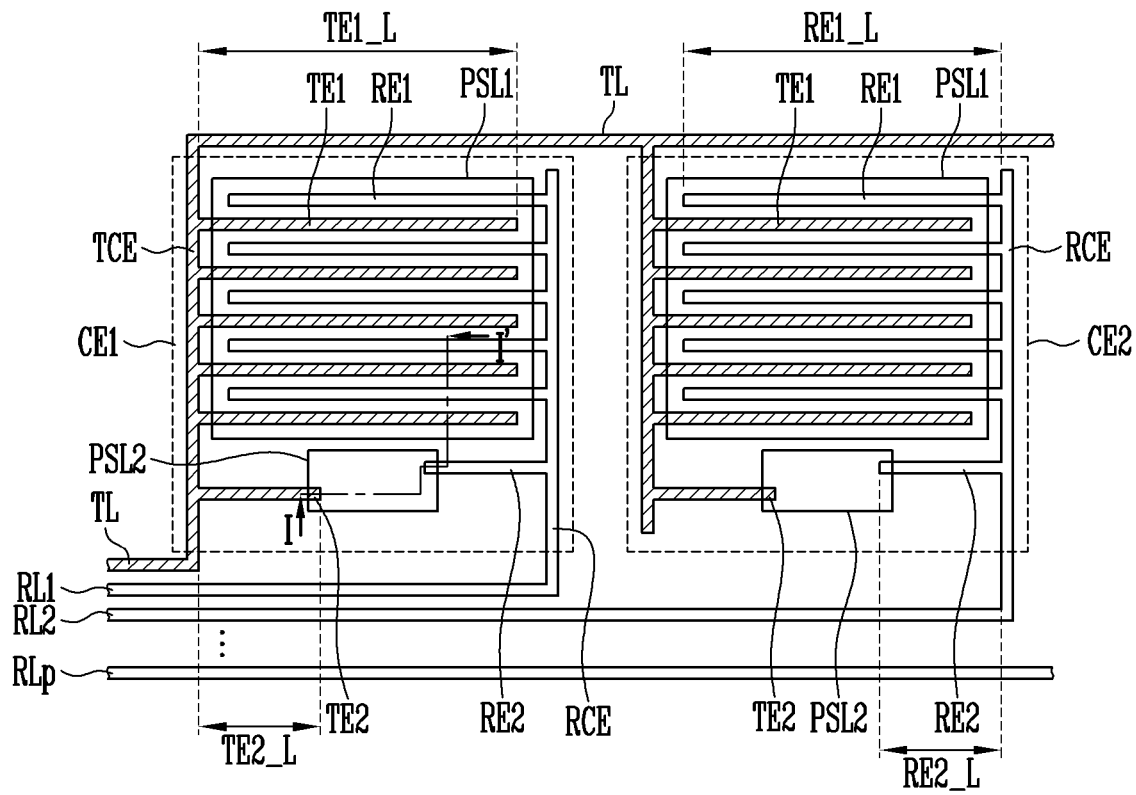
FIG. 2A is an enlarged plan view of region A of an exemplary embodiment of the pressure sensor of FIG. 1.
Figure 2B:
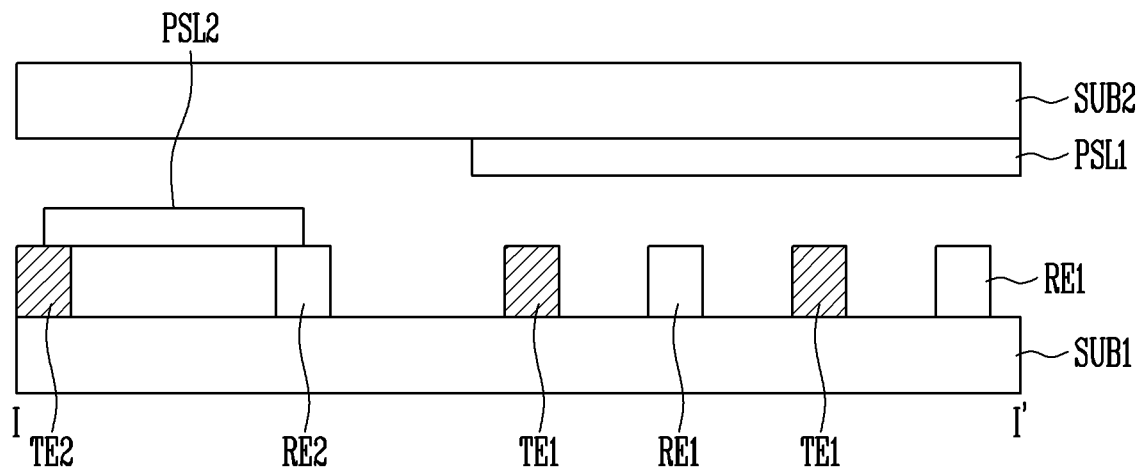
FIG. 2B is a cross-sectional view taken along line I-I' of FIG. 2A.
Figure 2C:
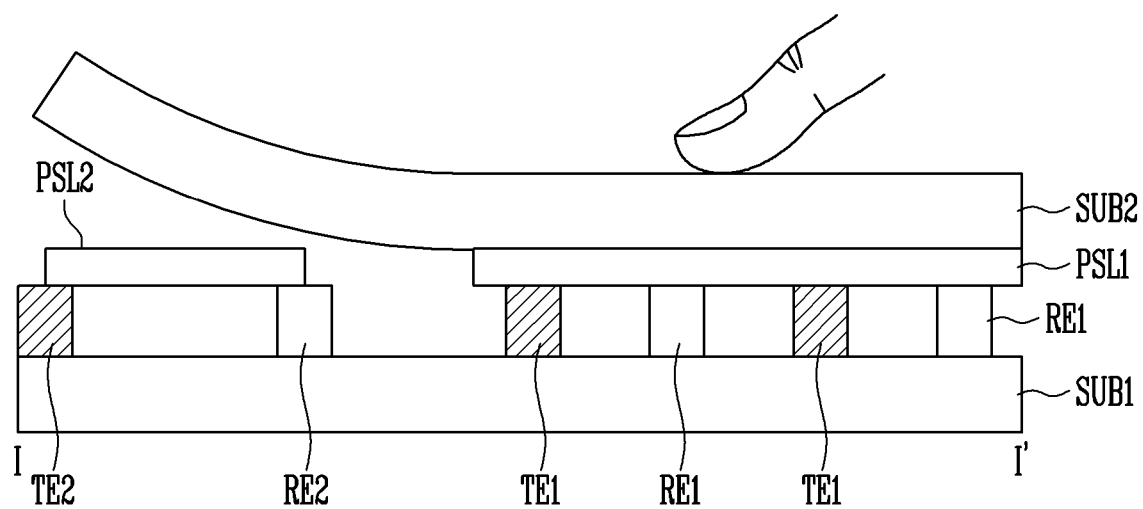
FIG. 2C is a cross-sectional view taken along line I-I' of FIG. 2A, which illustrates a case where a user presses a pressure sensor with his or her finger.

FIG. 1 is a plan view of an exemplary embodiment of a pressure (force) sensor constructed according to the principles of the invention. FIG. 2A is an enlarged plan view of region A of an exemplary embodiment of the pressure sensor of FIG. 1. FIG. 2B is a cross-sectional view taken along line I-I' of FIG. 2A. FIG. 2C is a sectional view taken along line I-I' of FIG. 2A, which illustrates a case where a user presses a pressure sensor with his or her finger.

Referring to FIGS. 1, 2A, 2B and 2C, a pressure sensor 10 includes a first substrate SUB1, a second substrate SUB2, a driving line TL, first to p-th sensing lines RL1 to RLp (where p is an integer of 2 or more), a driving pad TP, first to p-th sensing pads RP1 to RPp, and pressure sensing cells CE1 to CEp.

When pressure is applied to the second substrate SUB2 in the third direction Z, the pressure sensor 10 may sense pressure with which the user presses the pressure sensor 10 by detecting how the resistance values of the pressure sensing cells CE1 to CEp are changed depending on the pressure.

The first substrate SUB1 and the second substrate SUB2 may be opposed in a position facing each other. Each of the first substrate SUB1 and the second substrate SUB2 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the first substrate SUB1 and the second substrate SUB2 are not limited thereto, and may also be made of other materials such as fiberglass reinforced plastic (FRP) or the like.

The first substrate SUB1 and the second substrate SUB2 may be spaced apart from each other by a predetermined interval by a spacer, and may be coupled to each other through a coupling layer. The coupling layer may be implemented as a pressure-sensitive adhesive (PSA) layer or an adhesive layer. The coupling layer may be disposed along the periphery of the first substrate SUB1 and the second substrate SUB2. For example, the coupling layer may function to seal the inside of the pressure sensor 10 by enclosing edges of the first substrate SUB1 and the second substrate SUB2. Further, the coupling layer may function as a spacer for maintaining a uniform interval between the first substrate SUB1 and the second substrate SUB2. The coupling layer may not overlap the driving line TL, the sensing lines RL1 to RLp, the pressure sensing cells CE1 to CEp, the driving pad TP, and the sensing pads RP1 to RPp.

The coupling layer may be attached first to a first surface of the first substrate SUB1 or a first surface of the second substrate, and may then be attached to the first surface of the remaining substrate during a procedure for bonding the first substrate SUB1 and the second substrate SUB2 to each other. In an exemplary embodiment, coupling layers may be provided on the first surface of the first substrate SUB1 and the first surface of the second substrate SUB2, respectively, and the coupling layer of the first substrate SUB1 and the coupling layer of the second substrate SUB2 may be attached to each other during a procedure for bonding the first substrate SUB1 and the second substrate SUB2 to each other.

The pressure sensing cells CE1 to CEp may be disposed in a space between the first substrate SUB1 and the second substrate SUB2 provided by the coupling layers. The pressure sensing cells CE1 to CEp may independently sense pressures at corresponding locations. While the pressure sensing cells CE1 to CEp are shown as being arranged in a first direction X in FIG. 1, the arrangement of the pressure sensing cells CE1 to CEp is not limited thereto, and the pressure sensing cells may be arranged in various other forms or configurations.

Each of the pressure sensing cells CE1 to CEp may be coupled to at least one driving line TL and at least one sensing line RL1 to RLp. For example, as illustrated in FIG. 1, the pressure sensing cells CE1 to CEp may be coupled in common to the driving line TL, and may be coupled to the first to p-th sensing lines RL1 to RLp, respectively. For example, the first pressure sensing cell CE1 may be coupled to the driving line TL and the first sensing line RL1, and the second pressure sensing cell CE2 may be coupled to the driving line TL and the second sensing line RL2. Further, the third pressure sensing cell CE3 may be coupled to the driving line TL and the third sensing line RL3, and the p-th pressure sensing cell CEp may be coupled to the driving line TL and the p-th sensing line RLp.

The driving line TL may be coupled to the driving pad TP, and the first to p-th sensing lines RL1 to RLp may be coupled to the first to p-th sensing pads RP1 to RPp, respectively. For example, the first sensing line RL1 may be coupled to the first sensing pad RP1, the second sensing line RL2 may be coupled to the second sensing pad RP2, the third sensing line RL3 may be coupled to the third sensing pad RP3, and the p-th sensing line RLp may be coupled to the p-th sensing pad RPp.

While the driving pad TP and the first to p-th sensing pads RP1 to RPp are shown as being arranged on one side of the first substrate SUB1 in FIG. 1, the arrangement locations of the driving pad TP and the first to p-th sensing pads RP1 to RPp are not limited thereto. The driving pad TP and first to p-th sensing pads RP1 to RPp may be coupled to a pressure sensing circuit board FSCB through a coupling element such as an anisotropic conductive film.

The pressure sensing circuit board FSCB may include a pressure sensing unit FD. The pressure sensing unit FD may sense the pressure applied to the pressure sensing cells CE1 to CEp by applying a driving voltage to the driving line TL through the driving pad TP and by sensing current values and/or voltage values from the sensing lines RL1 to RLp through the sensing pads RP1 to RPp.

The pressure sensing unit FD may be mounted on the pressure sensing circuit board FSCB or on an additional circuit board coupled to the pressure sensing circuit board FSCB. When the pressure sensing unit FD is mounted on an additional circuit board coupled to the pressure sensing circuit board FSCB, it may be integrated with a driving unit which performs other functions.

Each of the pressure sensing cells CE1 to CEp may include a driving coupling electrode TCE, a sensing coupling electrode RCE, first driving electrodes TE1, first sensing electrodes RE1, a first pressure sensing layer PSL1, a second driving electrode TE2, a second sensing electrode RE2, and a second pressure sensing layer PSL2.

A first coupling electrode such as the driving coupling electrode TCE may couple the first driving electrodes TE1 and the second driving electrode TE2 to the driving line TL. In detail, the driving coupling electrode TCE may extend along a second direction Y intersecting the first direction X and may be coupled at both ends thereof to the driving line TL. Further, the first driving electrodes TE1 and the second driving electrode TE2 may each have a structure protruding from the driving coupling electrode TCE in the first direction X.

A second coupling electrode such as the sensing coupling electrode RCE may couple the first sensing electrodes RE1 and the second sensing electrode RE2 to one of the first to p-th sensing lines RL1 to RLp. In detail, the sensing coupling electrode RCE may extend along the second direction Y intersecting the first direction X and may be coupled at a first end thereof to one of the first to p-th sensing lines RL1 to RLp. Further, the first sensing electrodes RE1 and the second sensing electrode RE2 may each have a structure protruding from the sensing coupling electrode RCE in a direction opposite to the first direction X.

The first driving electrodes TE1, the first sensing electrodes RE1, the second driving electrode TE2, and the second sensing electrode RE2 may be disposed on the first substrate SUB1, and may be made of the same material and disposed on the same layer. For example, the first driving electrodes TE1, the first sensing electrodes RE1, the second driving electrode TE2, and the second sensing electrode RE2 may each include a conductive material. The conductive material may include metals or an alloy of the metals. For example, the conductive material includes at least one of gold (Au), silver (Ag), aluminum (Al), molybdenum (Mo), chrome (Cr), titanium (Ti), nickel (Ni), neodymium (Nd), copper (Cu), and platinum (Pt). Further, the first driving electrodes TE1, the first sensing electrodes RE1, the second driving electrode TE2, and the second sensing electrode RE2 may each be made of a transparent conductive material. For example, the transparent conductive material includes at least one of a silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), a carbon nanotube, and graphene.

The first driving electrodes TE1 and the first sensing electrodes RE1 may be disposed adjacent to each other while being spaced apart from each other. For example, as illustrated in the drawing, the first driving electrodes TE1 and the first sensing electrodes RE1 may be disposed in substantially parallel position, and may be alternately arranged on an XY plane in an interleaved manner. Further, the second driving electrode TE2 and the second sensing electrode RE2 may be disposed adjacent to each other while being spaced apart from each other, and may be disposed in a substantially parallel position on the XY plane. The first driving electrodes TE1 and the first sensing electrodes RE1 may be disposed in a first area separated from a second area in which the second driving electrode TE2 and the second sensing electrode RE2 are positioned.

The first pressure sensing layer PSL1 may be disposed on the first surface of the second substrate SUB2 facing the first substrate SUB1, and may be disposed to overlap the first driving electrodes TE1 and the first sensing electrodes RE1.

The resistance values of the first pressure sensing layer PSL1 and the second pressure sensing layer PSL2 may be changed according to the pressure applied thereto. For example, the first pressure sensing layer PSL1 and the second pressure sensing layer PSL2 may each be a Quantum Tunneling Composite (QTC) layer, as is known in the art. The first pressure sensing layer PSL1 and the second pressure sensing layer PSL2 may each include a polymer and conductive particles dispersed in the polymer. The conductive particles may be fine metal particles (or metal nanoparticles) such as nickel, aluminum, titanium, tin or copper particles.

The second pressure sensing layer PSL2 may be disposed on the first surface of the first substrate SUB1 facing the second substrate SUB2. The second pressure sensing layer PSL2 may overlap and contact the second driving electrode TE2 and the second sensing electrode RE2, as shown in FIG. 2B. Thus, the second driving electrode TE2 may be coupled to the second sensing electrode RE2 through the second pressure sensing layer PSL2.

When no pressure is applied to the pressure sensor 10, a gap may be present between the first pressure sensing layer PSL1 and the first driving electrodes TE1 and between the first pressure sensing layer PSL1 and the first sensing electrodes RE1, as shown in FIG. 2B. On the other hand, the second driving electrode TE2 and the second sensing electrode RE2 are in contact with the second pressure sensing layer PSL2 regardless of pressure, and thus the second driving electrode TE2 is electrically coupled to the second sensing electrode RE2 through the second pressure sensing layer PSL2.

In contrast, when pressure is applied to the second substrate SUB2 in the third direction Z intersecting the first and second directions X and Y, the first pressure sensing layer PSL1 comes into contact with at least some of the first driving electrodes TE1 and the first sensing electrodes RE1, as illustrated in FIG. 2C. Depending on the pressure applied to the second substrate SUB2, the area of the first pressure sensing layer PSL1 that contacts the first driving electrodes TE1 and the first sensing electrodes RE1 varies, so that the resistance values of the pressure sensing cells CE1 to CEp are changed, thus allowing the pressure sensing unit FD of the pressure sensor 10 to sense the pressure depending on the resistance values of the pressure sensing cells CE1 to CEp.

Each of the pressure sensing cells CE1 to CEp may include a first resistance and a second resistance. The first resistance is a variable resistance, which is generated by the first pressure sensing layer PSL1 spaced from but able to contact the first driving electrodes TE1 and the first sensing electrodes RE1 and which varies according to a change in contact area of the first pressure sensing layer PSL1 coming into contact with the first driving electrodes TE1 and the first sensing electrodes RE1 depending on the pressure. The second resistance is a fixed resistance, which is generated by the second pressure sensing layer PSL2 electrically coupled between the second driving electrode TE2 and the second sensing electrode RE2, and is predetermined in advance. Here, the second resistance is the initial resistance of the pressure sensor, which does not vary depending on the pressure applied to the pressure sensing cells CE1 to CEp.

The second driving electrode TE2 and the second sensing electrode RE2 are needed to form the second resistance that is the initial resistance, and thus the number of the second driving electrode TE2 and the second sensing electrode RE2 provided form the second, fixed resistance. For example, one second driving electrode TE2 and one second sensing electrode RE2 may be provided in each pressure sensing cell as shown in FIG. 2A. In contrast, since the first driving electrodes TE1 and the first sensing electrodes RE1 are configured to sense pressure according to the area coming into contact with the first pressure sensing layer PSL1, a plurality of the first driving electrodes TE1 and a plurality of the first sensing electrodes RE1 may be provided in each pressure sensing cell.

Figure 3:
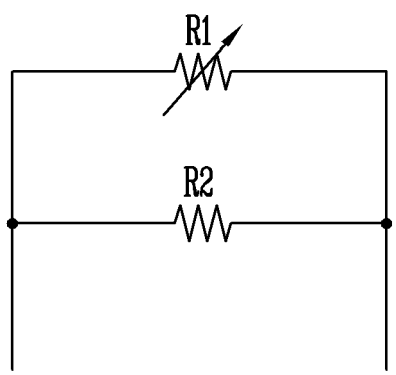
FIG. 3 is an equivalent circuit diagram representing the pressure sensing cell of FIG. 2A.

FIG. 3 is an equivalent circuit diagram representing the pressure sensor of FIG. 2A.

Referring to FIG. 3, each pressure sensing cell may be represented as including a first resistance R1 and a second resistance R2 coupled in parallel between a driving line TL and a corresponding sensing line. Here, the resistance R of the pressure sensing cell may be calculated, as represented by the following Equation (1):

$$\frac{1}{R} = \frac{1}{R1} + \frac{1}{R2} \quad (1)$$

If the second resistance R2, which is the initial resistance not related to pressure applied to the pressure sensing cell, is relatively low, a change in the resistance R of the pressure sensing cell depending on the pressure may be relatively narrow, and the pressure may not be detected or at least may be detected inaccurately due to the relatively low change in the resistance R. Accordingly, the sensitivity of detection of the pressure may decrease. If the second resistance R2 is relatively high, the change in the resistance R depending on the pressure may be relatively wide, and this may cause variations and/or distribution of the resistance values of the pressure sensing cells CE1 to CEp to be widened. Accordingly, the manufacturing cost of the pressure sensing unit FD sensing the resistance values of the pressure sensing cells CE1 to CEp may increase, and the manufacturing costs of the pressure sensor 10 including the pressure sensing unit FD may increase as well.

Exemplary embodiments of the pressure sensing cell of the invention can increase sensitivity and reduce manufacturing costs by maintaining the second resistance R2 at a suitable level. For example, when the pressure sensor is applied to a mobile phone, a force for operating the pressure sensor, that is, a force with which the user presses the pressure sensor may be about 200 gf to 300 gf. In this case, the suitable value of the second resistance R2 may be about 5 kΩ to 100 kΩ.

In an exemplary embodiment, as illustrated in FIG. 2A, in order to increase the distance between the second driving electrode TE2 and the second sensing electrode RE2, the length TE2_L of the second driving electrode TE2 is formed to be shorter than the length TE1_L of each of the first driving electrodes TE1, and the length RE2_L of the second sensing electrode RE2 is formed to be shorter than the length RE1_L of each of the first sensing electrodes RE1. In this case, the length of the second pressure sensing layer PSL2 coupling the second driving electrode TE2 to the second sensing electrode RE2 may be increased, and thus the second resistance R2 may be increased. The variations and/or distribution between the resistances of the pressure sensing cells CE1 to CEp may be adjusted depending on the length TE2_L of the second driving electrode TE2, the length RE2_L of the second sensing electrode RE2, and the length of the second pressure sensing layer PSL2.

Figure 4A:
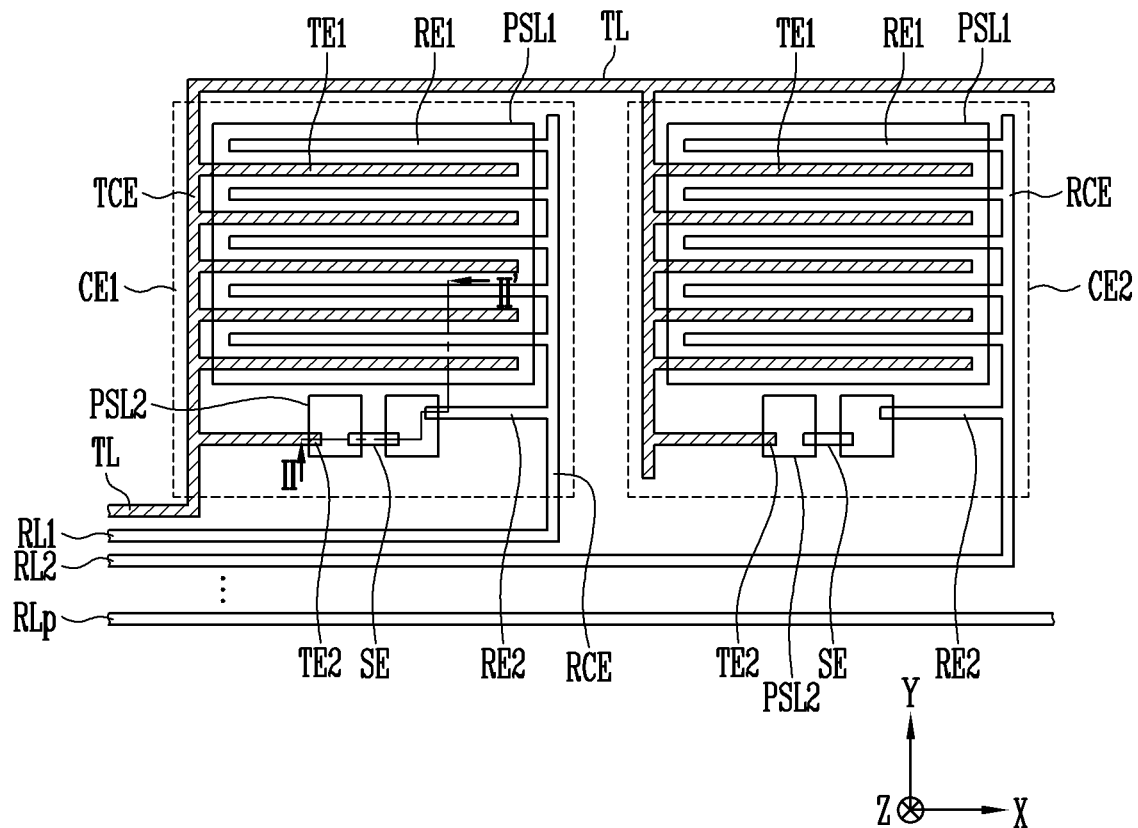
FIG. 4A is an enlarged plan view of region A of FIG. 1 according to another exemplary embodiment of the pressure sensor of the invention.
Figure 4B:
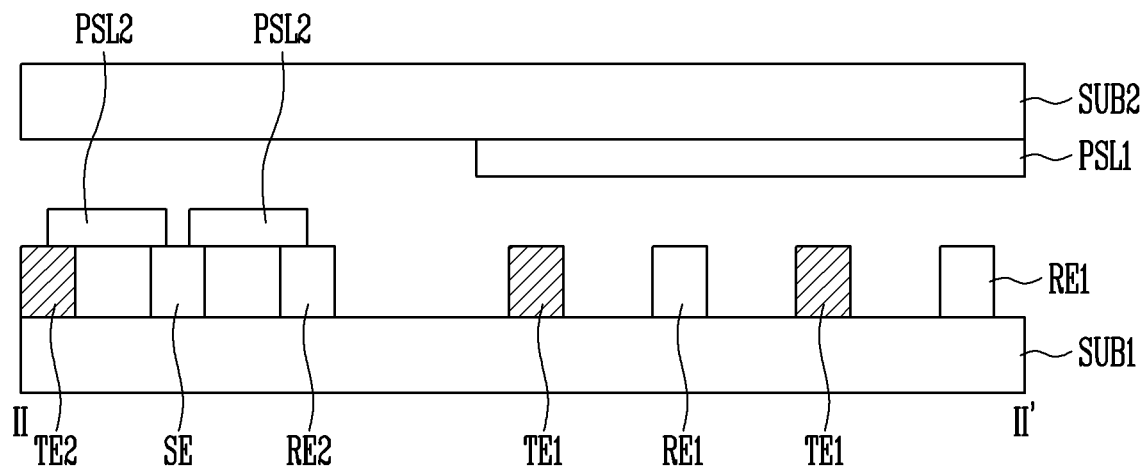
FIG. 4B is a cross-sectional view taken along line II-II' of FIG. 4A.
Figure 5A:
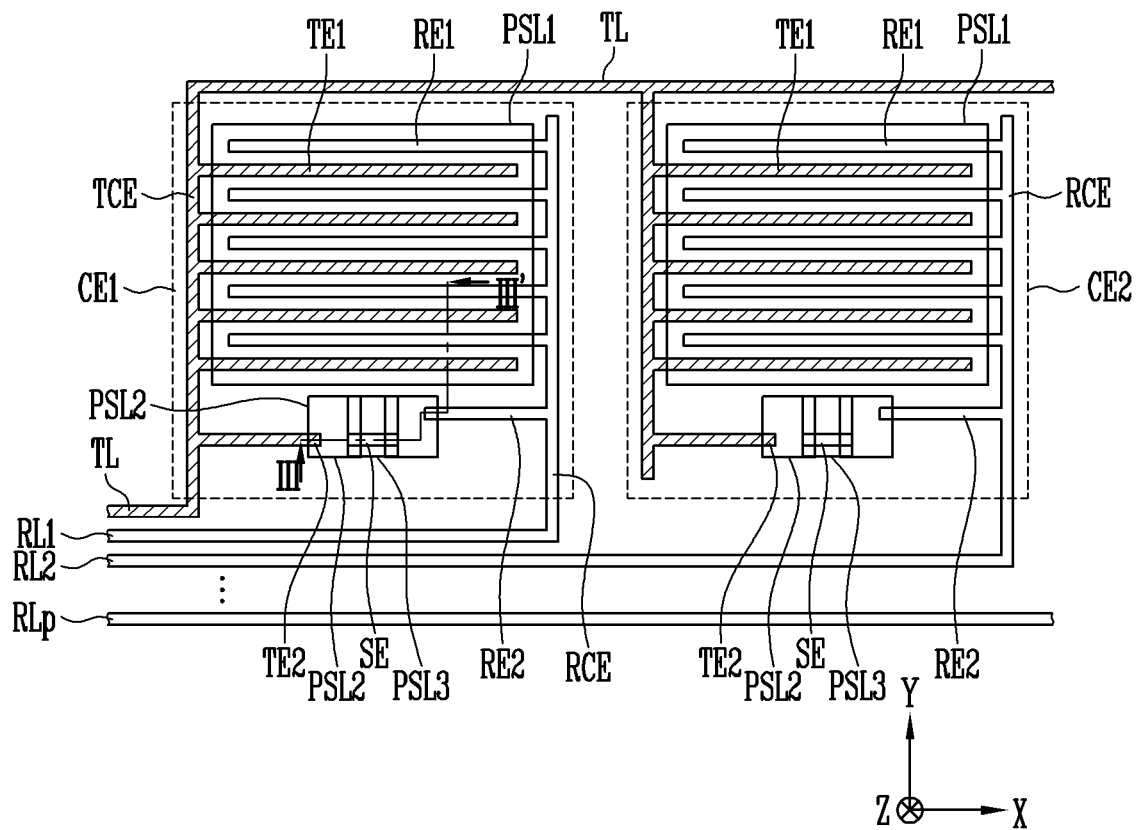
FIG. 5A is an enlarged plan view of region A of FIG. 1 according to still another exemplary embodiment of the pressure sensor of the invention.
Figure 5B:
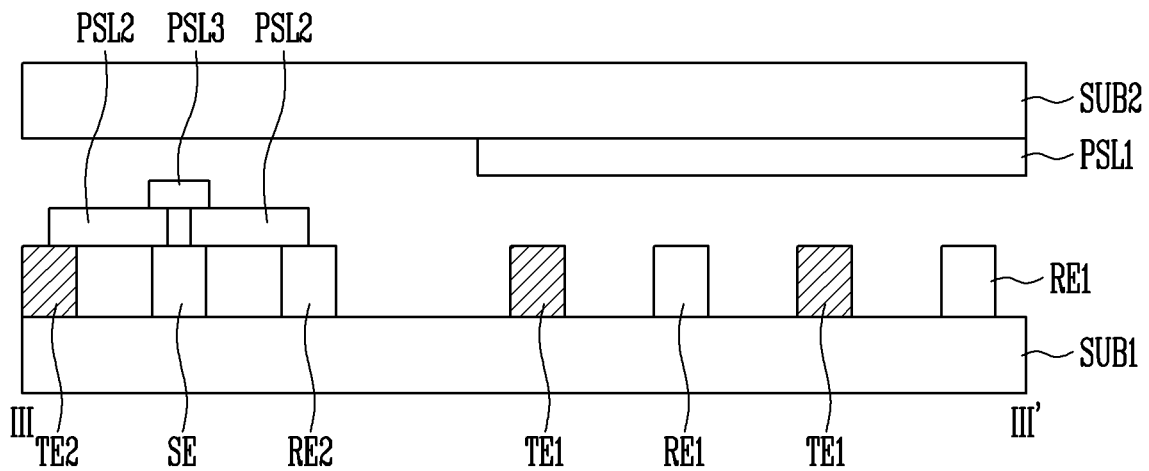
FIG. 5B is a cross-sectional view taken along line III-III' of FIG. 5A.

FIG. 4A is an enlarged plan view of region A of FIG. 1 according to another exemplary embodiment of the pressure sensor of the invention. FIG. 4B is a cross-sectional view taken along line II-II' of FIG. 4A. FIG. 5A is an enlarged plan view of region A of FIG. 1 according to still another exemplary embodiment of the pressure sensor of the invention. FIG. 5B is a cross-sectional view taken along line III-III' of FIG. 5A.

Referring to FIGS. 4A and 5A, the pressure sensor 10 may include a second pressure sensing layer PSL2 divided into a plurality of parts. While the second pressure sensing layer PSL2 is shown as being divided into two parts in the FIGS. 4A and 5A, exemplary embodiments are not limited thereto. The second pressure sensing layer PSL2 may be divided into two or more parts.

In detail, as illustrated in FIGS. 4A and 4B, the second pressure sensing layers PSL2 may be electrically coupled to each other through a sub-electrode SE. The sub-electrode SE may include the same material disposed on the same plane as the first driving electrodes TE1, the first sensing electrodes RE1, the second driving electrode TE2, and the second sensing electrode RE2. One of the second pressure sensing layers PSL2 adjacent to the second driving electrode TE2 may be in contact with parts of top surfaces of the second driving electrode TE2 and the sub-electrode SE, and the other one of the second pressure sensing layers PSL2 adjacent to the second sensing electrode RE2 may be in contact with parts of top surfaces of the second sensing electrode RE2 and the sub-electrode SE.

As such, the second driving electrode TE2 and the second sensing electrode RE2 may be coupled to each other through the two or more second pressure sensing layers PSL2 having a relatively long length, thus inducing an increase in the second resistance R2 of FIG. 3 which is the initial resistance. Also, the second resistance R2 may be set properly by adjusting the length of the sub-electrode SE as well as the lengths of the second pressure sensing layers PSL2.

Referring to FIGS. 5A and 5B, second pressure sensing layers PSL2 may also be coupled to each other through a third pressure sensing layer PSL3, as well as through a sub-electrode SE. The third pressure sensing layer PSL3 may be disposed on the second pressure sensing layers PSL2, and may be in contact with at least parts of top surfaces of the second pressure sensing layers PSL2. The third pressure sensing layer PSL3 may be made of a material having a resistance higher than that of the second pressure sensing layers PSL2 or the same material as the second pressure sensing layers PSL2. For example, the third pressure sensing layer PSL3 may be a Quantum Tunneling Composite (QTC) layer. The third pressure sensing layer PSL3 may include a polymer and conductive particles dispersed in the polymer. The conductive particles may be fine metal particles (or metal nanoparticles) such as nickel, aluminum, titanium, tin or copper particles.

In this case, the second driving electrode TE2 and the second sensing electrode RE2 may be coupled to each other by an increased distance compared to the FIG. 4B embodiments through the two or more second pressure sensing layers PSL2 and the third pressure sensing layer PSL3, thus inducing an increase in the second resistance R2 which is the initial resistance.

That is, the pressure sensor according to exemplary embodiments may increase the second resistance R2 which is the fixed initial resistance by increasing the distance between the second driving electrode TE2 and the second sensing electrode RE2 and connecting them to each other through one or more second pressure sensing layers such as PSL2 and/or PSL3, and the variations between the resistances of the pressure sensing cells CE1 to CEp may increase accordingly. Thus, the sensitivity of pressure detection may be improved.

Further, the pressure sensor according to exemplary embodiments may reduce the variations between the resistances of the pressure sensing cells CE1 to CEp by decreasing a first resistance value R1.

Figure 6A:
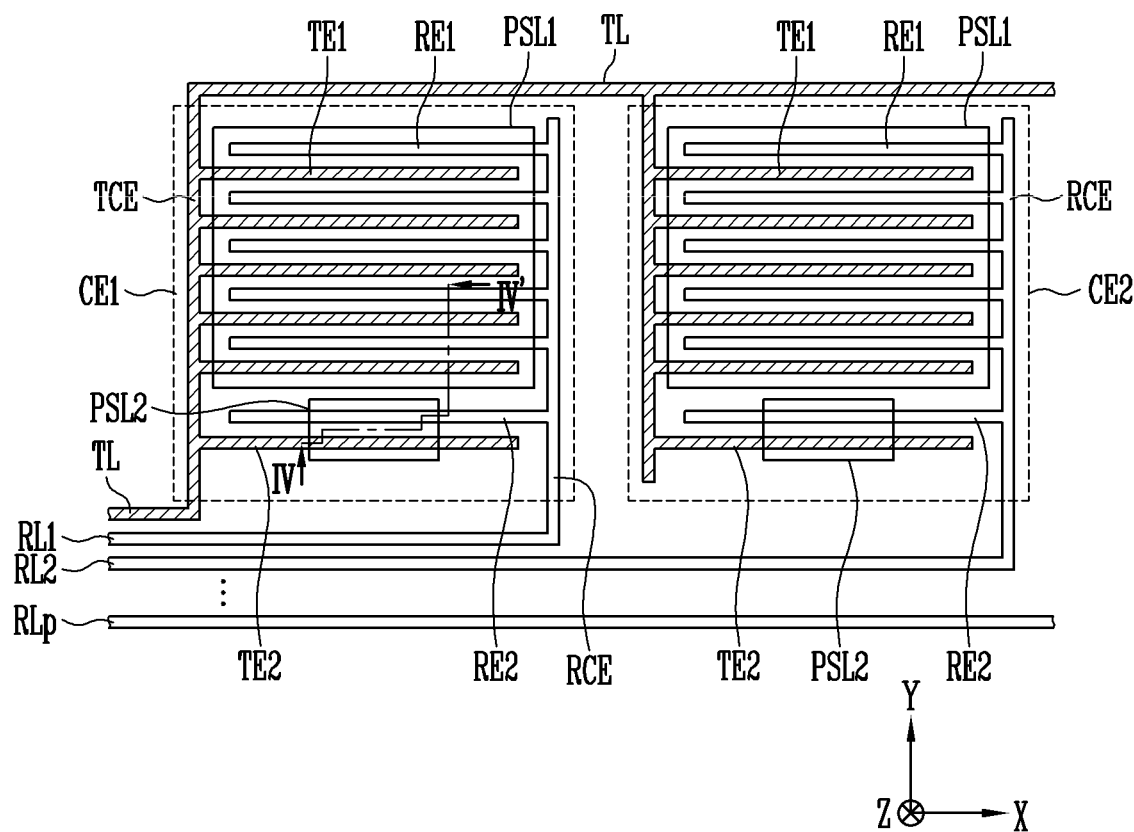
FIG. 6A is an enlarged plan view of region A of FIG. 1 according to still yet another exemplary embodiment of the pressure sensor of the invention.
Figure 6B:
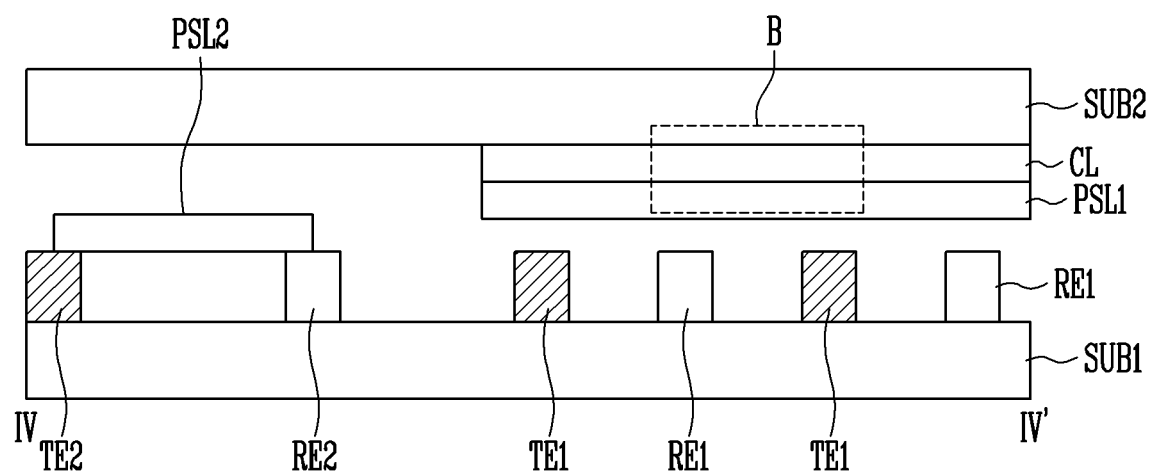
FIG. 6B is a cross-sectional view taken along line IV-IV' of FIG. 6A.
Figure 7:
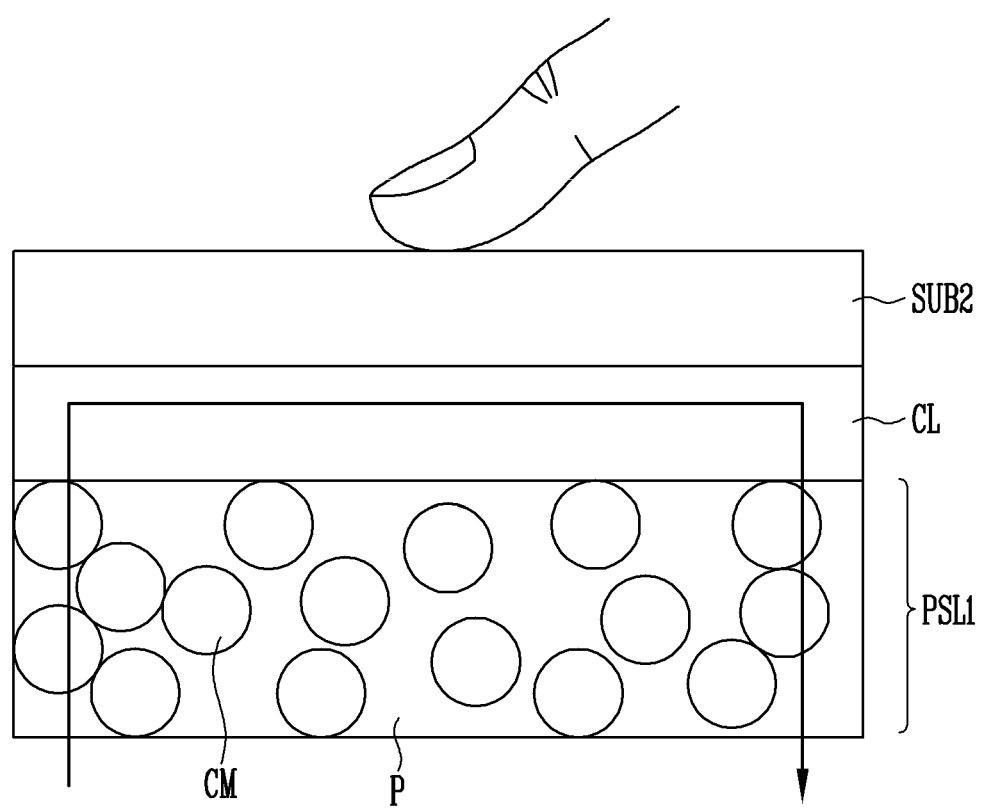
FIG. 7 is an enlarged cross-sectional view of region B of FIG. 6B illustrating how current flows through the pressure sensing cell of FIG. 6B when the user presses the pressure sensor with his or her finger.

FIG. 6A is an enlarged plan view of region A of FIG. 1 according to still yet another exemplary embodiment of the pressure sensor of the invention. FIG. 6B is a cross-sectional view taken along line IV-IV' of FIG. 6A. FIG. 7 is an enlarged cross-sectional view of region B of FIG. 6B illustrating how current flows through the pressure sensing cell of FIG. 6B when a user presses a pressure sensor with his or her finger.

Referring to FIGS. 6A, 6B, and 7, the pressure sensor 10 may include a first substrate SUB1, a second substrate SUB2, a driving line TL, first to p-th sensing lines RL1 to RLp (where p is an integer of 2 or more), a driving pad TP, first to p-th sensing pads RP1 to RPp, and a plurality of pressure sensing cells CE1 to CEp. Here, each of the pressure sensing cells CE1 to CEp may include a driving coupling electrode TCE, a sensing coupling electrode RCE, first driving electrodes TE1, first sensing electrodes RE1, a first pressure sensing layer PSL1, a second driving electrode TE2, a second sensing electrode RE2, a second pressure sensing layer PSL2, and a conductive layer CL interposed between the first pressure sensing layer PSL1 and the second substrate SUB2.

The first pressure sensing layer PSL1 may be a Quantum Tunneling Composite (QTC) layer. The first pressure sensing layer PSL1 may include a polymer and conductive particles dispersed in the polymer. The conductive particles may be fine metal particles (or metal nanoparticles) such as nickel, aluminum, titanium, tin or copper particles.

The conductive layer CL, which is a layer having a resistance lower than that of the first pressure sensing layer PSL1, may include a conductive material. The conductive material may include metals or an alloy of the metals. For instance, the conductive material may include gold (Au), silver (Ag), aluminum (Al), molybdenum (Mo), chrome (Cr), titanium (Ti), nickel (Ni), neodymium (Nd), copper (Cu), and platinum (Pt).

When the user presses the pressure sensor, as illustrated in FIG. 7, the first pressure sensing layer PSL1 comes into contact with the first driving electrodes TE1 and the first sensing electrodes RE1 which face the first pressure sensing layer PSL1. Here, since the resistance in the third direction Z of the first pressure sensing layer PSL1 is lower than the resistance in the XY plane of the first pressure sensing layer PSL1, current flowing between the first driving electrodes TE1 and the first sensing electrodes RE1 through the first pressure sensing layer PSL1 may be rapidly transferred to the conductive layer CL having a resistance lower than that of the first pressure sensing layer PSL1 along the third direction Z in the first pressure sensing layer PSL1, and may be moved again along a direction opposite to the third direction Z in the first pressure sensing layer PSL1.

That is, the transfer of charges to the conductive layer CL rather than to the first pressure sensing layer PSL1 is induced, so that the first resistance R1 may be decreased, and thus variations between the resistances of the respective pressure sensing cells CE1 to CEp may be decreased. Accordingly, the manufacturing cost of the pressure sensing unit FD sensing the resistances of the pressure sensing cells CE1 to CEp may decrease, and the manufacturing cost of the pressure sensor 10 including the pressure sensing unit FD may decrease as well.

Figure 8A:
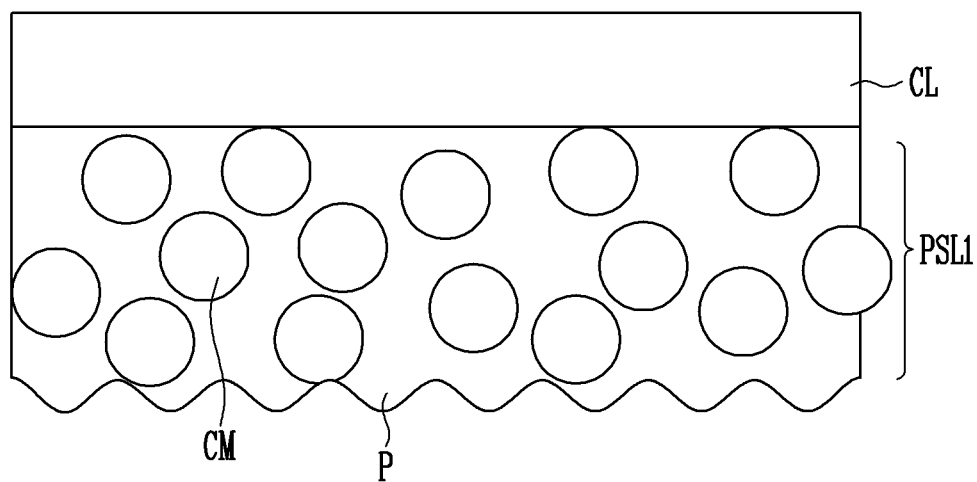
FIGS. 8A and 8B are enlarged cross-sectional views illustrating exemplary embodiments of the first pressure sensing layer of FIG. 6B.
Figure 8B:
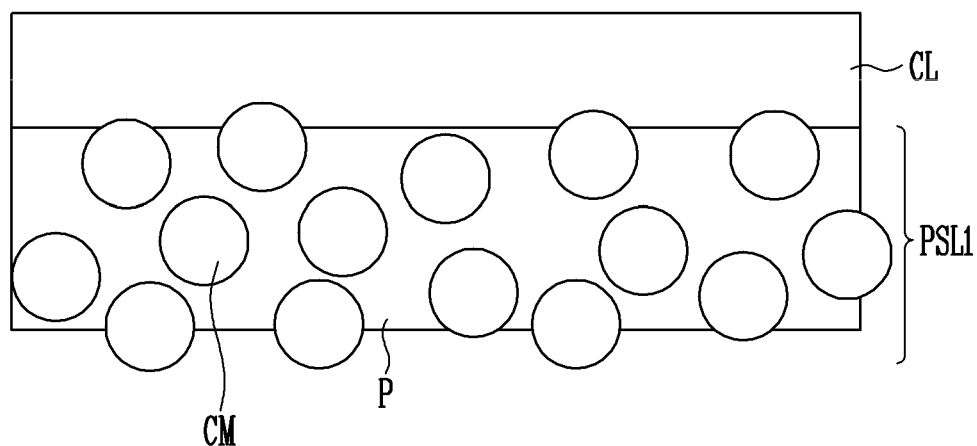

FIGS. 8A and 8B are enlarged cross-sectional views illustrating exemplary embodiments of the first pressure sensing layer of FIG. 6B.

Referring to FIGS. 6B, 8A, and 8B, at least part of a surface of the first pressure sensing layer PSL1 is formed in the shape of an uneven part, so that, when a user presses the pressure sensor, an area by which the first pressure sensing layer PSL1 and first driving electrodes TE1 and first sensing electrodes RE1 come into contact with each other may be increased. The uneven part may be formed by a surface of a polymer P of the first pressure sensing layer PSL1 as illustrated in FIG. 8A, or may be formed by conductive particles CM of the first pressure sensing layer PSL1 exposed from the surface of the first pressure sensing layer PSL1 as illustrated in FIG. 8B. The uneven part may be formed on a first surface of the first pressure sensing layer PSL1 facing the first driving electrodes TE1 and the first sensing electrodes RE1.

As described above, in the pressure sensor according to an exemplary embodiment, the conductive layer CL having a resistance lower than that of the first pressure sensing layer PSL1 may be disposed on the first pressure sensing layer PSL1, especially between the pressure sensing layer PSL1 and the second substrate SUB2, thus decreasing the resistances of pressure sensing cells CE1 and CE2 while reducing variations between the resistance values of the pressure sensing cells CE1 and CE2. Moreover, even if the pressure sensor is repeatedly pressed, crack or corrosion features may be improved owing to the conductive layer CL, thus enabling electrical characteristics of the pressure sensor to be maintained.

On the other hand, in case where the second resistance R2 increases to increase variations between the resistances of the pressure sensing cells CE1 to CEp, the value of the second resistance R2 may become excessively higher than a design value. In this case, a conductive layer, at least part of which overlaps the second pressure sensing layer PSL2, may be provided.

Figure 9A:
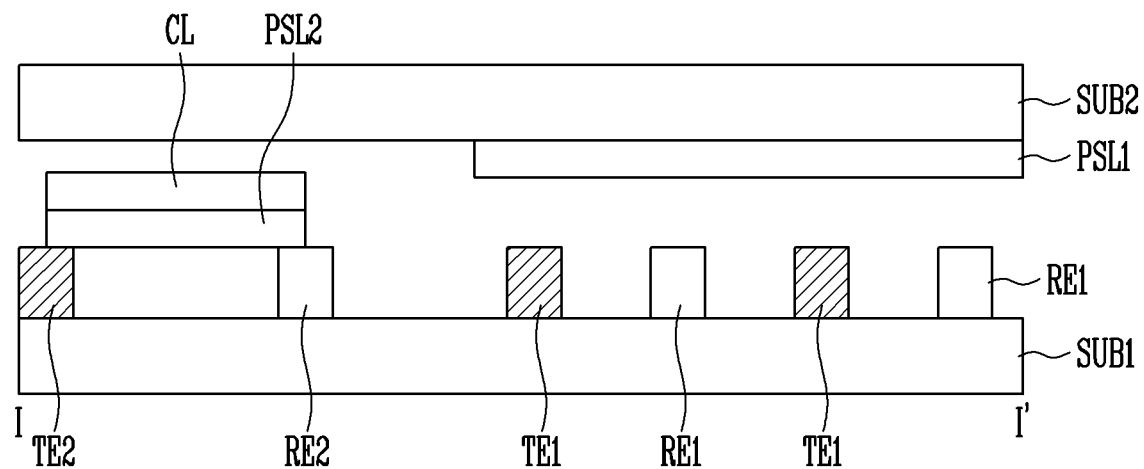
FIGS. 9A and 9B are cross-sectional views taken along line I-I' of FIG. 2A of still other exemplary embodiments of the pressure sensor of the invention.
Figure 9B:
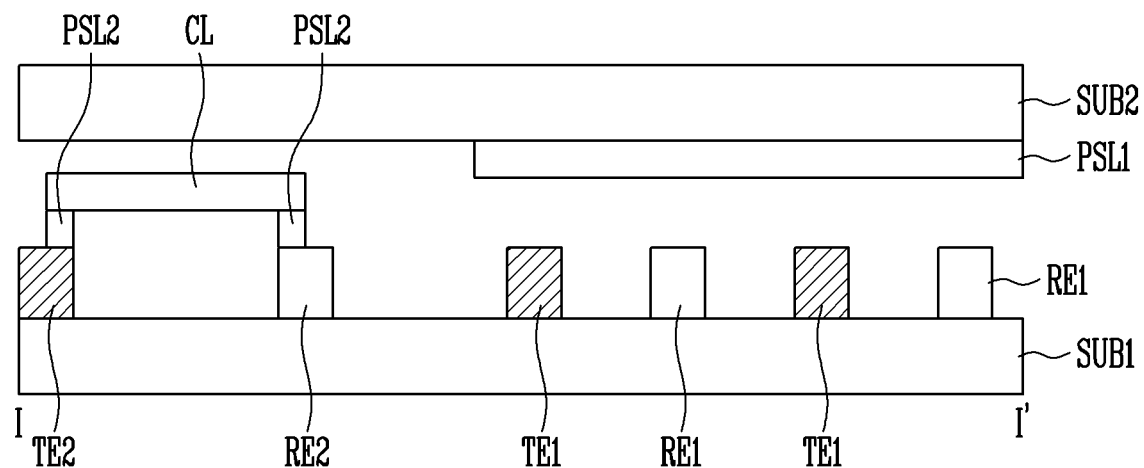

FIGS. 9A and 9B are cross-sectional views taken along line I-I' of FIG. 2A of still other exemplary embodiments of the pressure sensor of the invention.

Referring to FIGS. 9A and 9B, a second pressure sensing layer PSL2 may be in contact with a second driving electrode TE2 and a second sensing electrode RE2, and a conductive layer CL may be disposed on the second pressure sensing layer PSL2. Here, the conductive layer CL may include a conductive material, and the conductive material may include metals or an alloy of the metals. For example, the conductive material includes at least one of gold (Au), silver (Ag), aluminum (Al), molybdenum (Mo), chrome (Cr), titanium (Ti), nickel (Ni), neodymium (Nd), copper (Cu), and platinum (Pt).

In an exemplary embodiment, the area of the conductive layer CL may be identical to the area of the second pressure sensing layer PSL2 and then an entire part of a bottom surface of the conductive layer CL may be in contact with the second pressure sensing layer PSL2 as illustrated in FIG. 9A. In another exemplary embodiment, the area of the conductive layer CL may be different from the area of the second pressure sensing layer PSL2 and then only part of the bottom surface of the conductive layer CL may be in contact with the second pressure sensing layer PSL2 as illustrated in FIG. 9B.

On the other hand, in case where the first resistance R1 decreases to decrease variations between the resistances of the pressure sensing cells CE1 to CEp, the value of the first resistance R1 may become excessively lower than a design value. In this case, an additional pressure sensing layer may be provided such that at least part thereof overlaps the first pressure sensing layer PSL1, and thus the first resistance R1 may be suitably adjusted.

Figure 10:
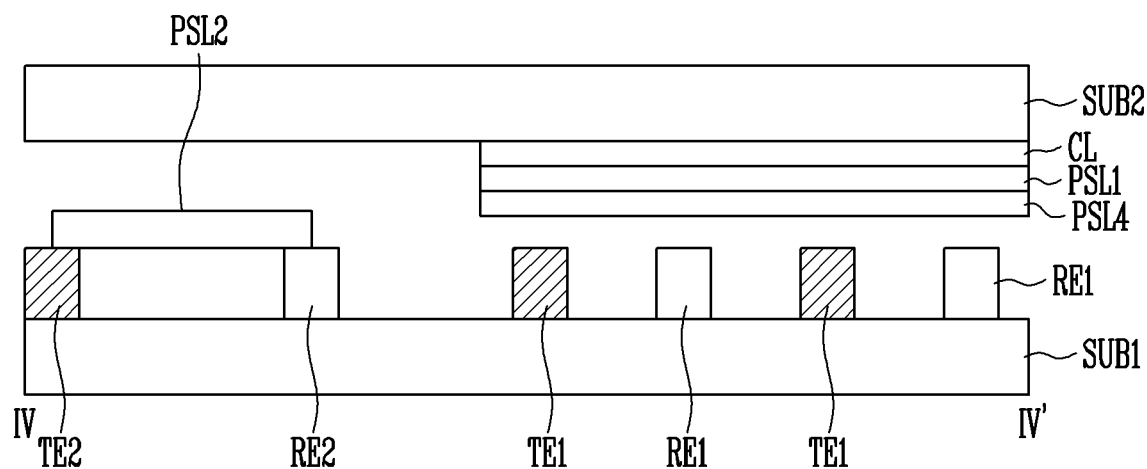
FIG. 10 is a cross-sectional view taken along line IV-IV' of FIG. 6B of a further exemplary embodiment of the pressure sensor of the invention.

FIG. 10 is a cross-sectional view taken along line IV-IV' of FIG. 6B of a further exemplary embodiment of the pressure sensor of the invention.

Referring to FIG. 10, a fourth pressure sensing layer PSL4 may be disposed on a first surface of a first pressure sensing layer PSL1, which faces first driving electrodes TE1 and first sensing electrodes RE1.

When the resistance of the first resistance R1 becomes excessively low due to a conductive layer CL disposed between the first pressure sensing layer PSL1 and a second substrate SUB2, the fourth pressure sensing layer PSL4 is configured to compensate for such a decrease in resistance. The fourth pressure sensing layer PSL4 may include a material having a resistance higher than that of the conductive layer CL. For example, the fourth pressure sensing layer PSL4 may be a Quantum Tunneling Composite (QTC) layer. The fourth pressure sensing layer PSL4 may include a polymer and conductive particles dispersed in the polymer. The conductive particles may be fine metal particles (or metal nanoparticles) such as nickel, aluminum, titanium, tin or copper particles.

Hereinafter, a display device having a pressure sensor constructed according to the exemplary embodiments will be described in detail with reference to the attached drawings.

Figure 11:
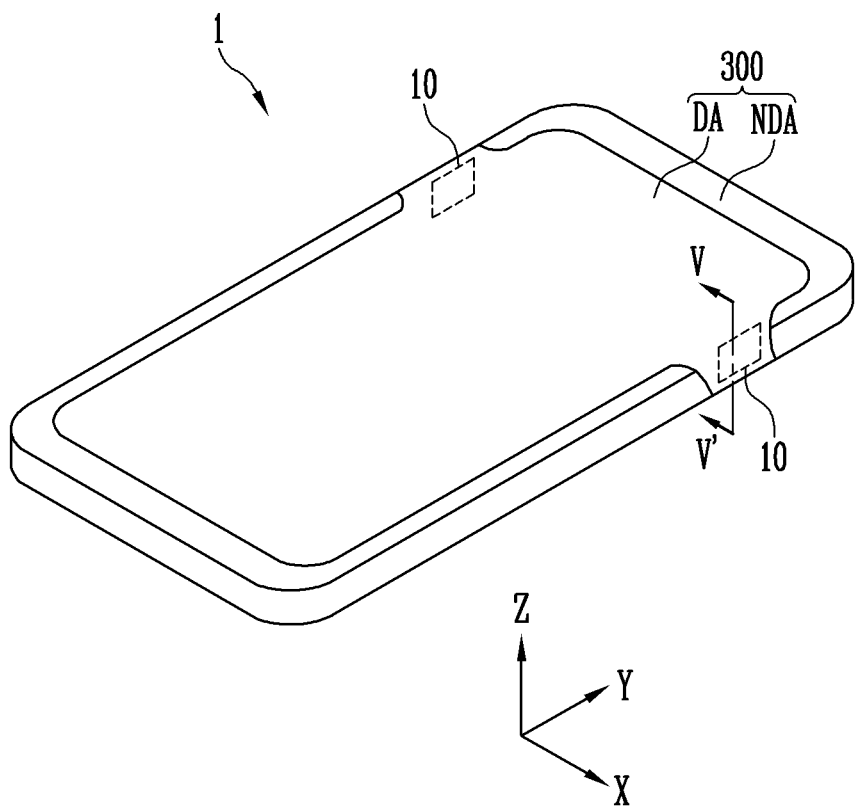
FIG. 11 is a perspective view of a display device having a pressure sensor constructed according to the principles of the invention.
Figure 12:
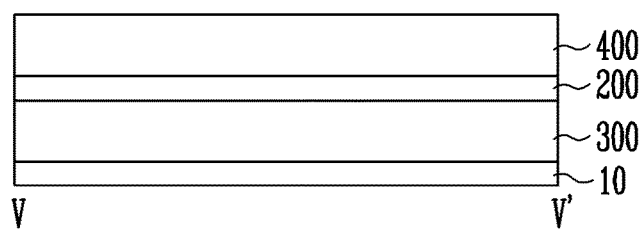
FIG. 12 is a cross-sectional view taken along line V-V' of FIG. 11.

FIG. 11 is a perspective view of a display device having a pressure sensor constructed according to the principles of the invention. FIG. 12 is a cross-sectional view taken along line V-V' of FIG. 11.

Referring to FIGS. 11 and 12, a display device 1 may include a pressure sensor 10 arranged on the bottom of a display panel 300 to correspond to a display area DA of the display panel 300.

The display panel 300 may include the display area DA and a non-display area NDA. The display area DA is an area in which an image is displayed, and the non-display area NDA is an area in which an image is not displayed and which is a peripheral area of the display area DA. As illustrated in FIG. 11, the non-display area NDA may enclose the display area DA, but is not limited thereto.

In the display area DA, pixels may be arranged. For example, a plurality of gate lines and a plurality of data lines that intersect the gate lines may be provided on a base substrate. Each of the pixels may include at least one thin-film transistor (TFT) coupled to one of gate lines and one of data lines and a display element coupled to the thin-film transistor (TFT).

The display element may include, for example, any one of a liquid crystal display (LCD) element, an electrophoretic display (EPD) element, an electrowetting display (EWD) element, and an organic light emitting display (OLED) element, or any other display element known in the art.

The display device 1 may have a structure in which the display area DA occupies a very wide portion, and the display area DA of the display panel 300 may extend not only to a front surface of the display device 1 but also to a portion of the side surface of the display device 1. For example, if the display device 1 is a mobile phone, the pressure sensor 10, instead of a mechanical button disposed on the side surface of the display device 1, may be included in the display device 1, and thus the pressure sensor 10 may function as the input means of the display device 1. For example, the pressure sensor 10 arranged on the side surface of the display device 1 may be used as a power button or a volume control button.

A touch panel 200 may be disposed on the top of the display panel 300. The touch panel 200 may include touch sensors for sensing a user's touch. The touch panel 200 may be implemented using various schemes, such as a capacitive touch panel, an electromagnetic resonance (EMR)-type touch panel, a resistive touch panel, an infrared touch panel, an electromagnetic induction-type touch panel, or an acoustic wave touch panel or may be implemented as combinations thereof.

A window 400 may be disposed on the touch panel 200. The window 200 may be provided on the surface of the display panel 300 from which light is emitted, thus protecting the surface of the display device 1.

The pressure sensor 10 may be arranged on the bottom of the display panel 300. The pressure sensor 10 may be an input means to generate signals for various functions such as power, volume control or the like, and may recognize external pressure. For example, when the pressure sensor 10 is a power button, the screen of the display device 1 may be turned on when pressure is applied to the pressure sensor 10. Further, when the pressure sensor 10 is a volume control button, the volume of the display device 1 may be increased or decreased according to sensed pressure.

The pressure sensor 10 may be implemented using the any one of the pressure sensors 10 described above with reference to FIGS. 1 to 10, or a combination of features thereof.

Figure 13A:
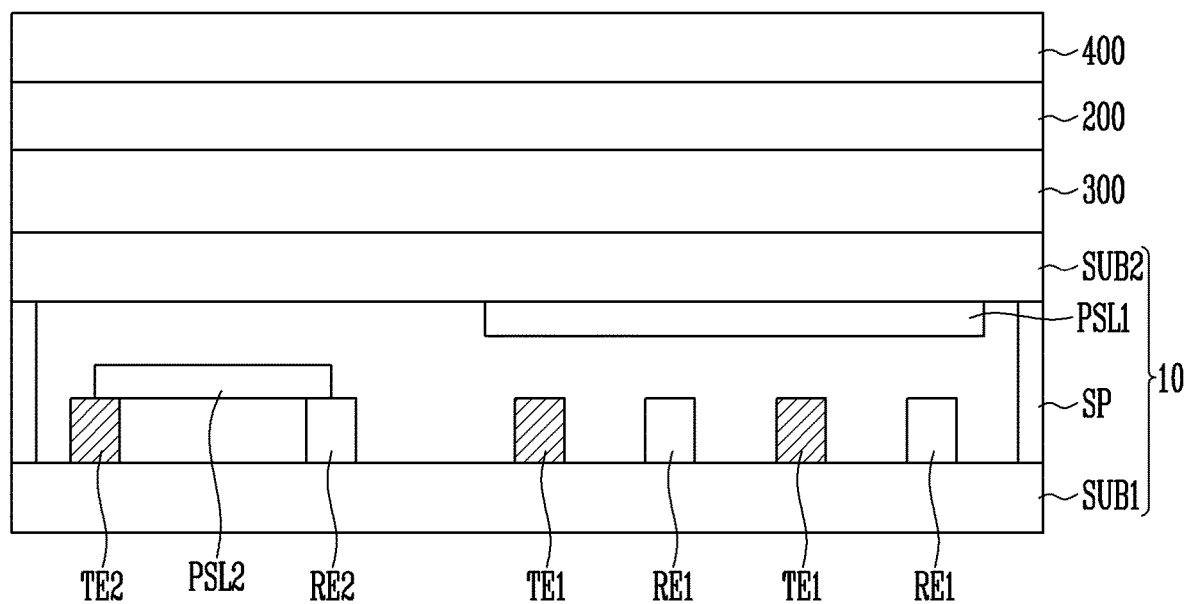
FIGS. 13A, 13B, and 13C are cross-sectional views of various exemplary embodiments of a display device having a pressure sensor constructed according to the principles of the invention.
Figure 13B:
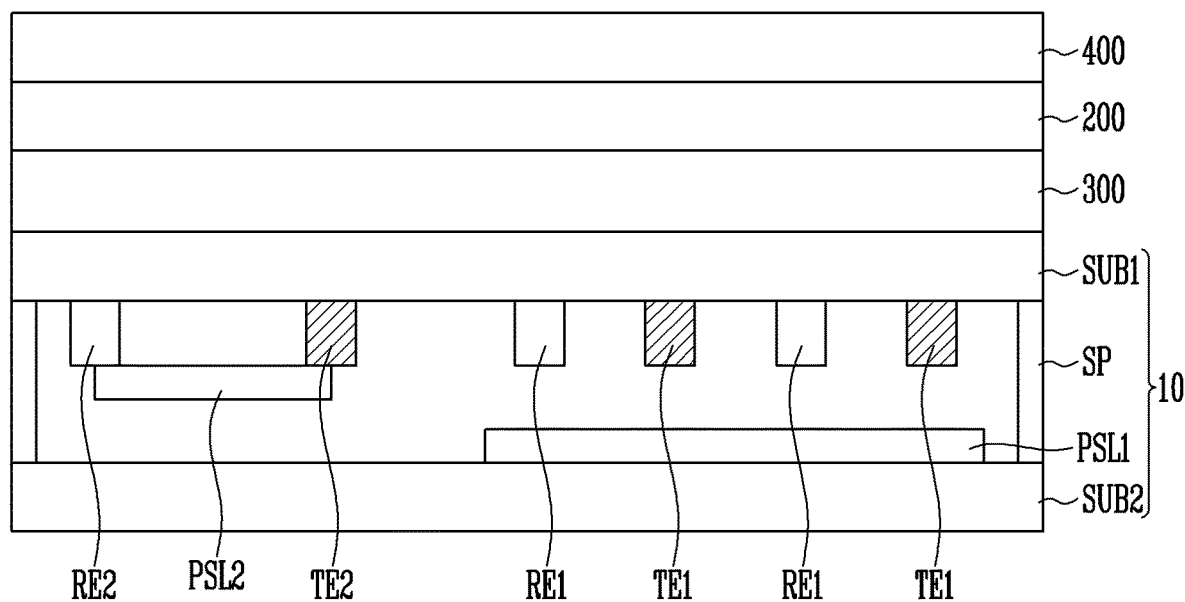
Figure 13C:
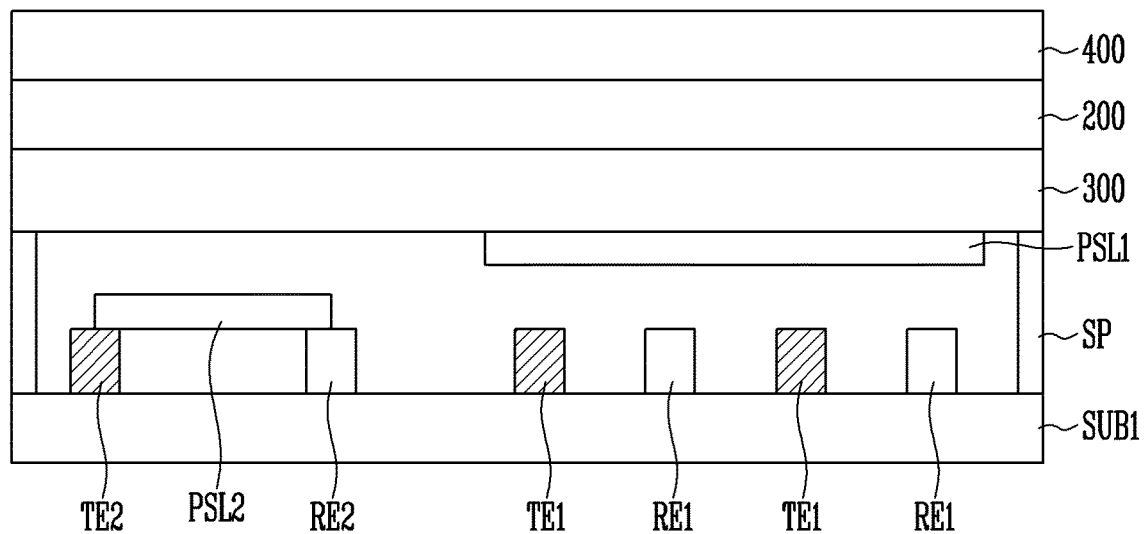

FIGS. 13A, 13B, and 13C are cross-sectional views of various exemplary embodiments of a display device having a pressure sensor constructed according to the principles of the invention. For the descriptive convenience, display devices employing the exemplary embodiment of the pressure sensor 10 of FIG. 2B are shown in FIGS. 13A to 13C. However, it is contemplated that the display device may employ other exemplary embodiments of pressure sensors according to the principles of the invention.

Referring to FIG. 13A, a pressure sensor 10 may be arranged on the bottom of a display panel 300, and a second substrate SUB2 may be disposed closer to the display panel 300 than the first substrate SUB1. In this case, when the user presses the top surface of the display device 1, that is, the window 400, the second substrate SUB2 is deformed, and thus a first pressure sensing layer PSL1 disposed on the second substrate SUB2 comes into contact with first driving electrodes TE1 and first sensing electrodes RE1.

Referring to FIG. 13B, the pressure sensor 10 may be arranged on the bottom of the display panel 300, and the first substrate SUB1 may be disposed closer to the display panel 300 than the second substrate SUB2. In this case, when the user presses the window 400, the first substrate SUB1 is deformed, and thus the first driving electrodes TE1 and the first sensing electrodes RE1 disposed on the first substrate SUB1 come into contact with the first pressure sensing layer PSL1.

Also, one of the first substrate SUB1 and the second substrate SUB2 of the pressure sensor 10 may be a base substrate of the display device 300. That is, pixels may be disposed on a first surface of the base substrate, and pressure sensing cells CE1 to CEp of the pressure sensor 10 may be arranged on a second surface of the base substrate. In this manner, the thickness of the display device having the pressure sensor 10 may be decreased. For example, referring to FIG. 13C, when the base substrate of the display panel 300 functions as the second substrate SUB2 of the pressure sensor 10, the second substrate SUB2 may be removed, and the first pressure sensing layer PSL1 may be disposed on a surface of the base substrate on which pixels are not arranged. In this case, pressure sensing cells CE1 to CEp may be disposed between the base substrate of the display panel 300 and the first substrate SUB1 of the pressure sensor 10.

Further, when the base substrate of the display panel 300 functions as the first substrate SUB1 of the pressure sensor 10, the first substrate SUB1 may be removed. In this case, pressure sensing cells CE1 to CEp may be disposed between the base substrate of the display panel 300 and the second substrate SUB2 of the pressure sensor 10.

While the pressure sensor 10 is shown as being arranged on a surface of the display panel 300 from which light is not emitted in FIGS. 13A to 13C, the arrangement of the pressure sensor 10 is not limited thereto. For example, the pressure sensor 10 may also be arranged on a surface of the display panel 300 from which light is emitted.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A pressure sensor, comprising:
a first substrate and a second substrate;
a first driving electrode and a second driving electrode disposed on a first surface of the first substrate facing the second substrate and coupled to a first coupling electrode, the second driving electrode being shorter than the first driving electrode;
a first sensing electrode and a second sensing electrode disposed on the first surface of the first substrate and coupled to a second coupling electrode, the second sensing electrode being shorter than the first sensing electrode;
a first pressure sensing layer disposed on a first surface of the second substrate in a position facing the first substrate and overlapping and spaced from the first driving electrode and the first sensing electrode by a gap; and
a second pressure sensing layer physically contacting the second driving electrode and the second sensing electrode to electrically couple the second driving electrode and the second sensing electrode to each other, the second pressure sensing layer including a conductive material.

2. The pressure sensor according to claim 1, wherein the second pressure sensing layer comprises at least two second pressure sensing layers electrically coupled to each other.

3. The pressure sensor according to claim 2, further comprising a sub-electrode coupling the at least two second pressure sensing layers to each other.

4. The pressure sensor according to claim 3, wherein the sub-electrode comprises substantially the same material disposed in substantially the same plane as that of the first driving electrode, the first sensing electrode, the second driving electrode, and the second sensing electrode.

5. The pressure sensor according to claim 3, further comprising a third pressure sensing layer coupling the at least two second pressure sensing layers to each other, the third pressure sensing layer at least partially contacting top surfaces of the second pressure sensing layers.

6. The pressure sensor according to claim 1, further comprising a conductive layer, at least part of which is in contact with the second pressure sensing layer.

7. The pressure sensor according to claim 6, wherein the conductive layer has a resistance lower than a resistance of the second pressure sensing layer.

8. The pressure sensor according to claim 1, wherein each of the first pressure sensing layer and the second pressure sensing layer includes a polymer and conductive particles dispersed in the polymer.

9. The pressure sensor of claim 1, wherein:
the first pressure sensing layer forms a first resistance between the first driving electrode and the first sensing electrode when the first pressure sensing layer contacts the first driving electrode and the first sensing electrode based upon on pressure applied to the pressure sensor;
the second pressure sensing layer forms a second resistance between the second driving electrode and the second sensing electrode; and
the first resistance and the second resistance are electrically coupled to each other in parallel between the first coupling electrode and the second coupling electrode.

10. A pressure sensor, comprising:
a first substrate and a second substrate;
a first driving electrode, a second driving electrode, a first sensing electrode, and a second sensing electrode which are disposed on a first surface of the first substrate facing the second substrate, wherein the second driving electrode is electrically coupled to the first driving electrode and the second sensing electrode is electrically coupled to the first sensing electrode;
a first pressure sensing layer disposed on a first surface of the second substrate in a position facing the first substrate and overlapping and spaced from the first driving electrode and the first sensing electrode by a gap;
a conductive layer disposed on the first surface of the second substrate, and at least partially contacting the first pressure sensing layer; and
a second pressure sensing layer physically contacting the second driving electrode and the second sensing electrode to electrically couple the second driving electrode and the second sensing electrode to each other, the second pressure sensing layer including a conductive material.

11. The pressure sensor according to claim 10, wherein the conductive layer is disposed closer to the second substrate than the first pressure sensing layer.

12. The pressure sensor according to claim 11, wherein the conductive layer has a resistance lower than a resistance of the first pressure sensing layer.

13. The pressure sensor according to claim 11, further comprising a fourth pressure sensing layer disposed on a first surface of the first pressure sensing layer so that the fourth pressure sensing layer is closer to the first driving electrode and the first sensing electrode than the first pressure sensing layer.

14. The pressure sensor according to claim 13, wherein the fourth pressure sensing layer has a resistance higher than a resistance of the conductive layer.

15. The pressure sensor according to claim 10, wherein the first pressure sensing layer has a first surface facing the first driving electrode and the first sensing electrode, and the first surface of the first pressure sensing layer includes an uneven part.

16. The pressure sensor according to claim 15, wherein:
the first pressure sensing layer includes a polymer and conductive particles dispersed in the polymer, and
the uneven part comprises the conductive particles exposed from a surface of the polymer or by a surface of the polymer having a shape of the uneven part.

17. A display device, comprising:
a display panel; and
a pressure sensor disposed on a first surface of the display panel,
wherein the pressure sensor comprises:
a first substrate and a second substrate;
a first driving electrode and a second driving electrode disposed on a first surface of the first substrate facing the second substrate and coupled to a first coupling electrode, the second driving electrode being shorter than the first driving electrode;

a first sensing electrode and a second sensing electrode disposed on the first surface of the first substrate and coupled to a second coupling electrode, the second sensing electrode being shorter than the first sensing electrode;

a first pressure sensing layer disposed on a first surface of the second substrate in a position facing the first substrate and overlapping and spaced from the first driving electrode and the first sensing electrode by a gap; and a second pressure sensing layer physically contacting the second driving electrode and the second sensing electrode to electrically couple the second driving electrode and the second sensing electrode to each other, the second pressure sensing layer including a conductive material.

18. The display device according to claim 17, wherein:

the display panel comprises a base substrate and pixels arranged on the base substrate, and one of the first substrate and the second substrate of the pressure sensor comprises the base substrate of the display panel.

19. A display device, comprising:

a display panel; and a pressure sensor disposed on a first surface of the display panel, wherein the pressure sensor comprises:

a first substrate and a second substrate;

a first driving electrode, a second driving electrode, a first sensing electrode, and a second sensing electrode all of which are disposed on a first surface of the first substrate facing the second substrate, wherein the second driving electrode is electrically coupled to the first driving electrode and the second sensing electrode is electrically coupled to the first sensing electrode;

a first pressure sensing layer disposed on a first surface of the second substrate facing the first substrate in a position overlapping and spaced from the first driving electrode and the first sensing electrode by a gap;

a conductive layer disposed on the first surface of the second substrate, and at least partially contacting the first pressure sensing layer; and a second pressure sensing layer physically contacting the second driving electrode and the second sensing electrode to electrically couple the second driving electrode and the second sensing electrode to each other, the second pressure sensing layer including a conductive material.

20. The display device according to claim 19, wherein:

the display panel comprises a base substrate and pixels arranged on the base substrate, and one of the first substrate and the second substrate of the pressure sensor comprises the base substrate of the display panel.

* * * * *